(12) United States Patent
Craen et al.

(10) Patent No.: US 8,260,129 B2
(45) Date of Patent: Sep. 4, 2012

(54) OPTICAL DEVICE FOR HIGH QUALITY AND COMPACT CAMERA MODULE

(75) Inventors: Pierre Craen, Embourg (BE);
Yves-Sebastien Boulin,
Tassin-la-Demi-Lune (FR); Paul Fuller,
Lyons (FR)

(73) Assignee: Varioptic, S.A., Lyons (FR)

( * ) Notice: Subject to any disclaimer, the term of this patent is extended or adjusted under 35 U.S.C. 154(b) by 16 days.

(21) Appl. No.: 12/974,918

(22) Filed: Dec. 21, 2010

(65) Prior Publication Data

US 2011/0158634 A1    Jun. 30, 2011

Related U.S. Application Data

(60) Provisional application No. 61/289,858, filed on Dec. 23, 2009.

(51) Int. Cl.
*G03B 17/00* (2006.01)

(52) U.S. Cl. .......................................................... 396/72

(58) Field of Classification Search ................... 396/72; 359/665, 666
See application file for complete search history.

(56) References Cited

U.S. PATENT DOCUMENTS

| 7,573,646 | B2 | 8/2009 | Craen et al. | |
| 7,773,875 | B2* | 8/2010 | Jung et al. | 396/129 |
| 2007/0146894 | A1* | 6/2007 | Humpston | 359/666 |
| 2008/0304160 | A1* | 12/2008 | Hendriks et al. | 359/666 |
| 2009/0190232 | A1 | 7/2009 | Craen et al. | |
| 2011/0158634 | A1* | 6/2011 | Craen et al. | 396/439 |

FOREIGN PATENT DOCUMENTS

| EP | 1 662 276 A1 | 5/2006 |
| EP | 1 884 805 A1 | 2/2008 |
| EP | 1992968 A1 | 11/2008 |
| JP | 2007-171329 A | 7/2007 |

* cited by examiner

*Primary Examiner* — W. B. Perkey
(74) *Attorney, Agent, or Firm* — Osha Liang LLP

(57) ABSTRACT

An optical device for a lens assembly of a camera module is disclosed. The optical device includes a liquid lens having at least one fixed lens and a transparent window, facing each other and delimiting, at least in part, an internal volume containing two immiscible liquids having different optical indices, and a first and a second electrode. The liquids form an interface moveable by application of a voltage between said electrodes. The optical device also includes a liquid lens holder, wherein the liquid lens holder has at least one electrical contact for contacting one electrode of the liquid lens, and at least one Z reference datum for aligning the fixed lens of the liquid lens with other optical elements of the lens assembly.

6 Claims, 8 Drawing Sheets

OPTICAL DEVICE FOR HIGH QUALITY AND COMPACT CAMERA MODULE

TECHNICAL FIELD OF THE INVENTION

The invention relates to an optical device for a camera module, and more particularly an optical device comprising a liquid lens with a fixed lens and a liquid lens holder adapted for centring the liquid lens with other fixed lenses of a camera module.

BACKGROUND OF THE INVENTION

Optical industry and optical manufacturers commonly use the outer diameter (OD) of lenses to align them with an accuracy of a few μm (3-10 μm). Centring a stack of lenses is performed via an accurate mechanical datum that is built in the lens barrel. This is a very cost effective solution. The method is applied, for example, for aligning lenses of an imaging system. The imaging system may be, for example, part of a mobile phone. The approach of passive lens alignment implies that:

all lenses have been manufactured in order to align within a few μm (2-5 μm) the optical axis with respect to the OD of the lenses. This can involve some constraints on the design of the system itself or can require adding an extra step in the manufacturing process through a centring operation (ex: machining).

the edges of the lenses are thick enough to form a good reference, for example >~0.3 mm thick; and the OD is accessible to provide an accurate mechanical datum.

FIGS. 1A and 1B show some examples of passive lens alignment using the outer diameter of lenses 10, aligned within a lens barrel 12.

Sometimes, opto-mechanical designers prefer to get the optical axis reference straight through the optical surface. FIG. 2 illustrates an example of passive lens alignment using the optical axis 14 of the lenses 10 as alignment reference. Still, this is not always possible, for example due to surface curvatures of lenses that might be not adapted to perform accurate centring. Also, the lens stack obtained from that kind of passive alignment can present undesirable stray light (flare, ghosts).

In some cases, passive alignment is not possible and active alignment is needed that definitely adds a long step to the process and brings the final cost up. In particular, this is the case when using a liquid lens with a curved window to cover the liquid chamber. Such liquid lens is described, for example, in European Patent Application No EP 1662276 in the name of the Applicant. The different constraints lead to an optical-mechanical design that requires active alignment of the liquid lens with respect to the rest of the lens stack.

Moreover, in a mobile phone camera, the space to integrate a camera module is very limited and there is no easy way to integrate a liquid lens in a lens barrel of such camera module. This is due to the fact that the liquid lens—whose actual packaging is about 7.75 mm OD—needs to be arranged on the object side to get the biggest focusing efficiency (range and speed). Such lens can not be integrated in a regular front aperture lens barrel concept where the front lens is always much smaller than the last lens (closest one to the sensor) whose OD is slightly smaller than the diagonal of the sensor (typically a 1/2.5 inch sensor).

FIG. 3 shows a liquid lens assembly 100 that may be implemented with a 5M (5 mega pixels) ⅓ inch sensor (or a bigger sensor like 1/2.5 inch) lens module for mobile application. The liquid lens assembly 100 includes a front lens 110 and a transparent window 112, which are facing each other and delimiting, in part, an internal volume containing two immiscible liquids 114, 116 with different optical indices. The front lens 110 serves as a front window of the liquid lens. One of the liquids is preferably an insulating liquid, for example comprising oil and/or an oily substance, and the other is preferably a conductive liquid comprising, for example, an aqueous solution. The front lens 110 and the window 112 are preferably formed of an optical transparent material such as glass. The liquid lens assembly 100 further comprises a cap 120 and a body 122 also acting as the electrodes of the liquid lens. The liquid lens assembly further includes a lens barrel 101.

Because the optical axis of the front lens is not easily and efficiently available due the structure of the liquid lens package, an active alignment of the liquid lens and the front lens is usually required to insure good optical quality. In active alignment, a lens is moved and centred with respect to the optical axis of the rest of the lens stack. For example, to actively align the liquid lens and the front lens with the required centring accuracy, a Modulation Transfer Function (MTF) measurement device can be used. Via a feedback loop between the measurement device and a micrometric actuator, the MTF measurements can be used to balance and optimize the MTF in the field of view.

A liquid lens and centring thereof in a lens barrel is described in patent application No US20090190232 of the same applicant, the content of which is incorporated herein by reference. This document discloses a lens barrel comprising a liquid lens and a number of fixed lenses, where said lens barrel has contact regions to align the fixed lenses using their outer diameter. It addresses the problem of centring the fixed lenses with respect to the optical axis of a lens stack. Patent application No EP1992968 of the same applicant, the content of which is incorporated herein by reference, discloses vertical positioning of fixed lenses in a lens barrel comprising a liquid lens, wherein the fixed lenses seal the liquid lens. Patent application No EP1884805 of the same applicant, the content of which is incorporated herein by reference, discloses passive alignment means for a liquid lens having a two-part body and two fixed lenses. Patent application JP 2007171329 discloses a lens barrel comprising a liquid lens and alignment mechanisms therefor.

However, the entire mechanical datum of the lens to be aligned (by centring) with respect to other lenses is not always available, or the optical axis of the lens to be aligned is not well aligned with respect to its mechanical datum (i.e., its outer diameter OD) during the manufacturing process. It is therefore desirable to provide location features that could avoid active alignment.

Another constraint is that electrical contact with the liquid lens needs to be provided to the two electrodes (for example electrodes being respectively the bodycone and the cap of the liquid lens). Flexible Printed Circuit (FPC) gluing could be a solution, however this solution requires a double tape conductive glue/tape that are known to be not reliable and to create contact failure during the assembly process. Other solutions such as spring metal solutions described in EP1992968 could be used and are more reliable than a FPC gluing, however the pressure applied through the metal spring contact can modify the position of the liquid lens, and thus deteriorate the optical alignment of the liquid lens and the optical elements.

Most of the low profile lens module for mobile phone application are so called front aperture system. The front aperture system allows to minimise the chief ray angle (CA)

on the sensor. Low CA are required to have efficient micro lenses array which will benefit to the overall sensitivity of the imaging system. In the particular when using the liquid lens in such a module, the aperture stop is placed on the front lens on the liquid lens.

Another important aspect relates to the control of the distance between the lenses in the lens module with a high accuracy. Accuracy on the position along the optical axis between each lens of a lens system are typically ranging from 5-10 microns. The most critical distance is usually the distance between the lenses that are on the opposite side of the sensor. In particular when using a liquid lens comprising at least one fixed lens (instead of two windows being transparent plates), one critical parameter is the distance between the fixed lens of the liquid lens and the next plastic or glass lens of the lens arrangement of the lens assembly. A datum B of the liquid lens could be used as a mechanical reference, but the accuracy is very easily ranging around 15-30 microns for the position of the lens with respect to the datum B. Such level of accuracy is suitable to insure high level of MTF (over 70% MTF on axis and over 40% MTF at 80% FOV @ ⅓ of the Niquist Frequency related to the sensor resolution) for low profile lens module.

Experience has shown that to get very accurate Glass moulded with Datum B below 15 µm, the production yield is ranging around 80% with a very poor reliability performances.

The invention hereafter described is to overcome at least one of the above problems related to the use of a liquid lens integrating a fixed lens, in a camera module.

SUMMARY

According to a first aspect, the invention is related to an optical device for a lens assembly of a camera module, said optical device comprising a liquid lens having at least one fixed lens and a liquid lens holder, said holder comprising at least one electrical contact for contacting one electrode of the liquid lens, and comprising at least one Z reference datum for aligning said fixed lens of the liquid lens with other optical elements of the lens assembly.

According to a preferred embodiment, the liquid lens holder comprises at least one electrical contact to connect to the liquid lens and accurate X Y Z location features for aligning the liquid lens with the optical elements of a lens module. This embodiment allowing to avoid the use of active alignment (AA).

According to a further embodiment, the liquid lens holder comprises at least one electrical contact to connect to the liquid lens and accurate XYZ location features that have been adjusted at the liquid lens manufacturing level. No AA is required to integrate a lens integrating a fixed lens in a lens module.

According to another embodiment, the liquid lens holder comprises a stop aperture.

According to another embodiment, the liquid lens holder comprises a protective window. The liquid lens may be used as a cover for the camera module.

According to another embodiment, the liquid lens holder is made of plastic moulded parts, machined or embossed metallic parts, or made of a combination of both.

According to a further aspect of the invention, there is providing a method for aligning a fixed lens of a liquid lens with other optical elements of a lens system.

According to a further aspect, the invention is related to a lens assembly comprising an optical device comprising a liquid lens having at least one fixed lens and a liquid lens holder, said holder comprising at least one electrical contact for contacting one electrode of the liquid lens, and comprising at least one Z reference datum for aligning said fixed lens with other optical elements of the lens system.

DETAILED DESCRIPTION

Figure 1A:
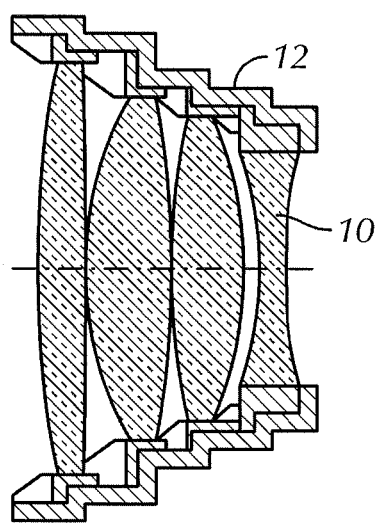
FIGS. 1A and 1B show examples of passive lens alignment systems using the outer diameter of lenses in accordance with prior art designs.
Figure 1B:
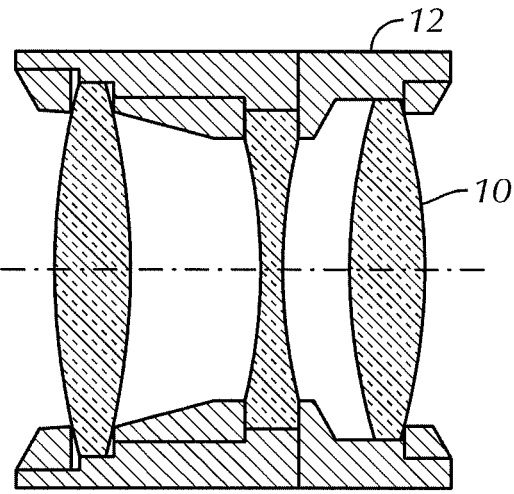
Figure 2:
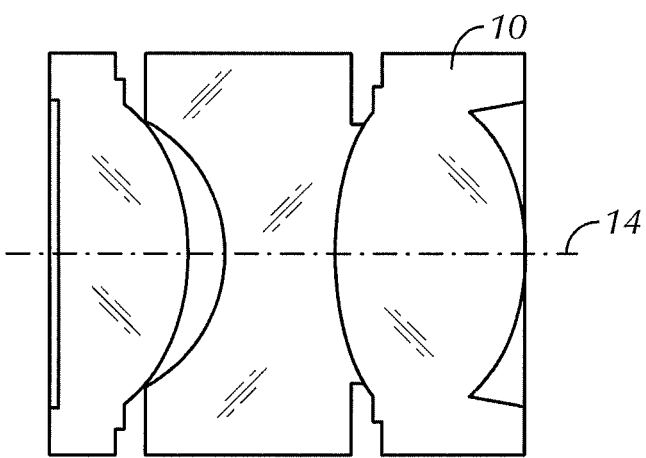
FIG. 2 shows examples of passive lens alignment using other references on the lens than the outer diameter in accordance with prior art designs.
Figure 3:
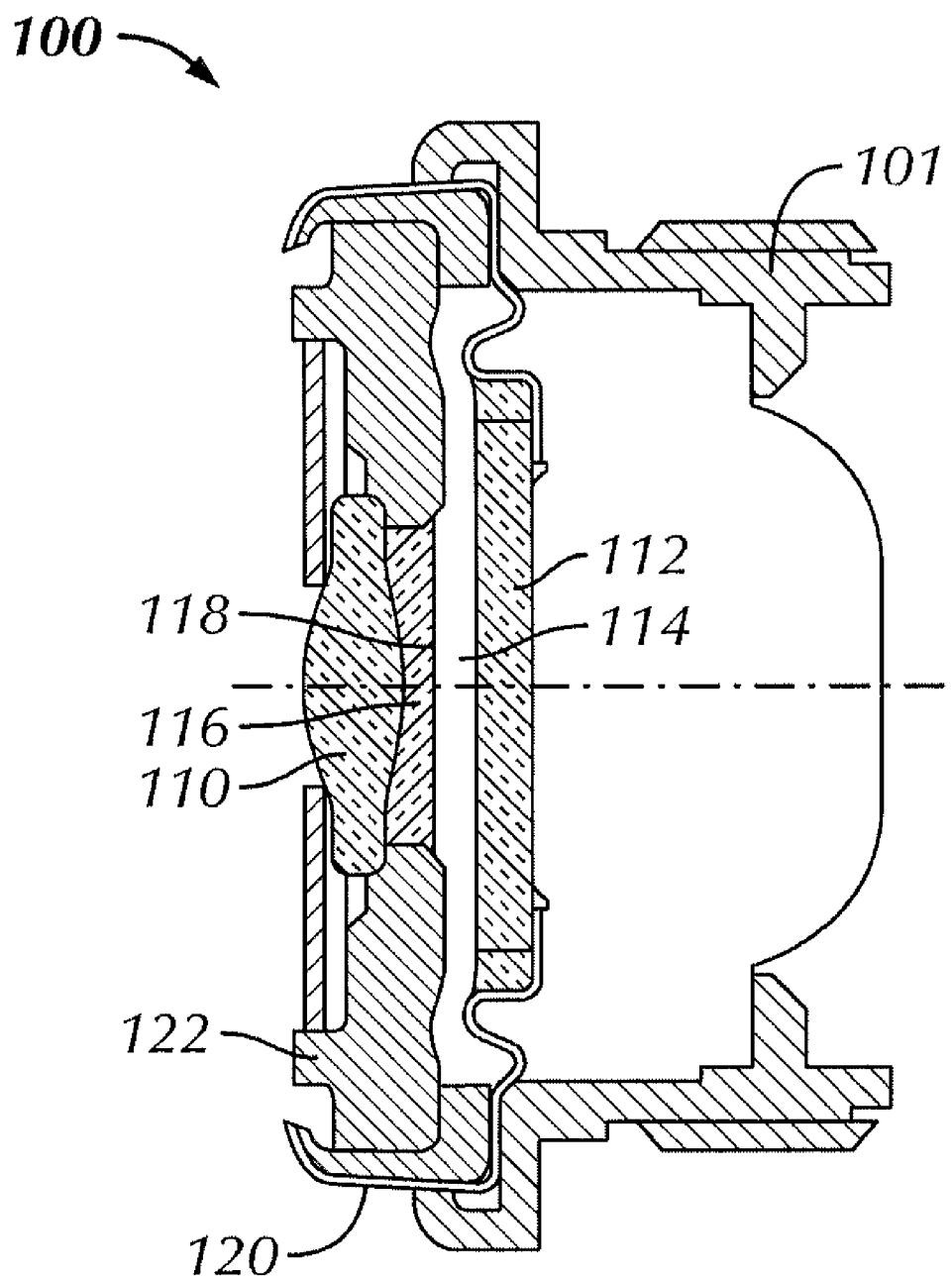
FIG. 3 shows a cross-sectional view of a lens module comprising a liquid lens.
Figure 4:
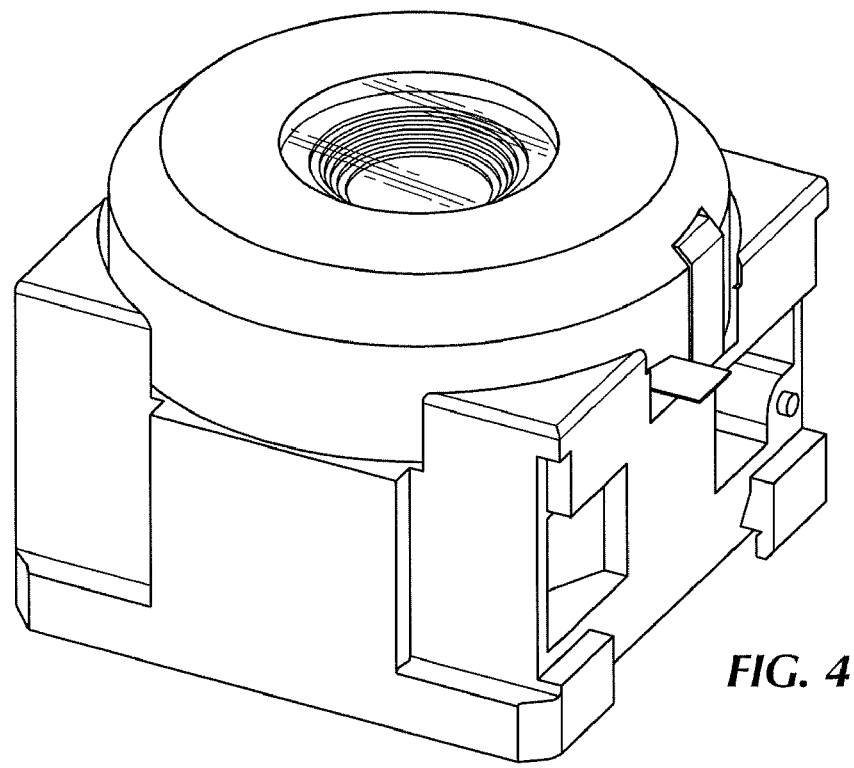
FIG. 4 represents a 3D view of a camera module with an optical element according to the invention, the optical element comprising the liquid lens and its holder (liquid lens holder also called cover).
Figure 5:
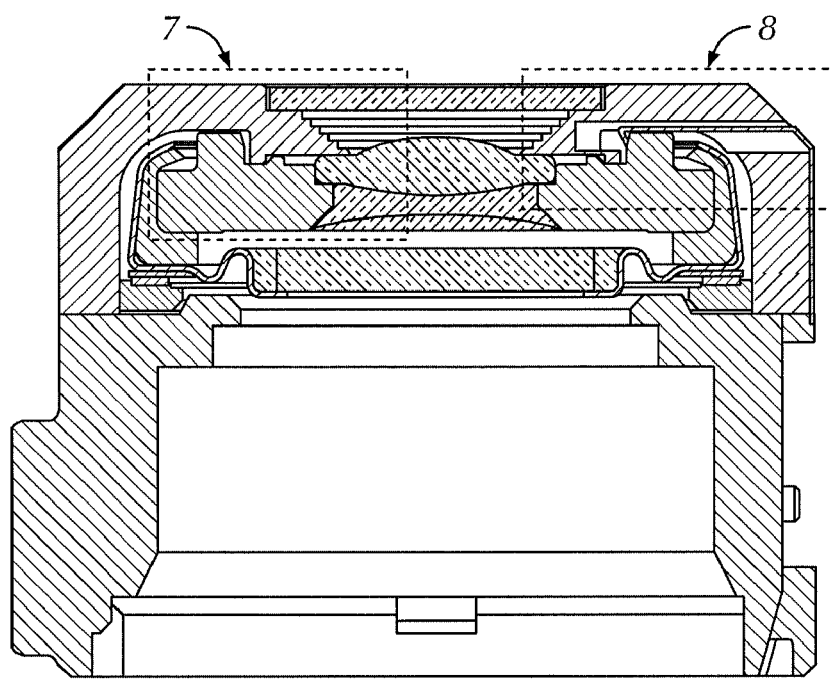
FIG. 5 is a cross section of a camera module comprising an optical element according to one embodiment of the invention.
Figure 6A:
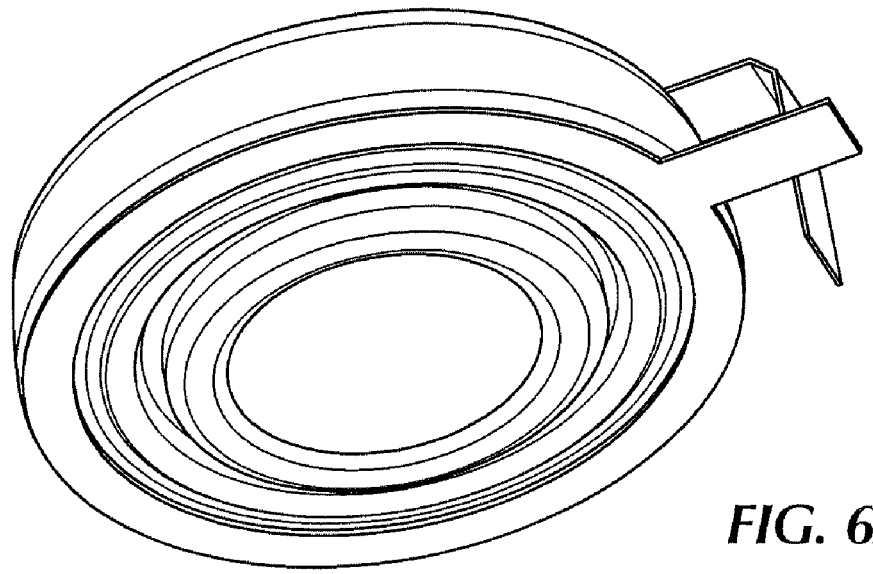
FIGS. 6A and 6B are respectively underside and up side view of optical element according to one embodiment of the invention.
Figure 6B:
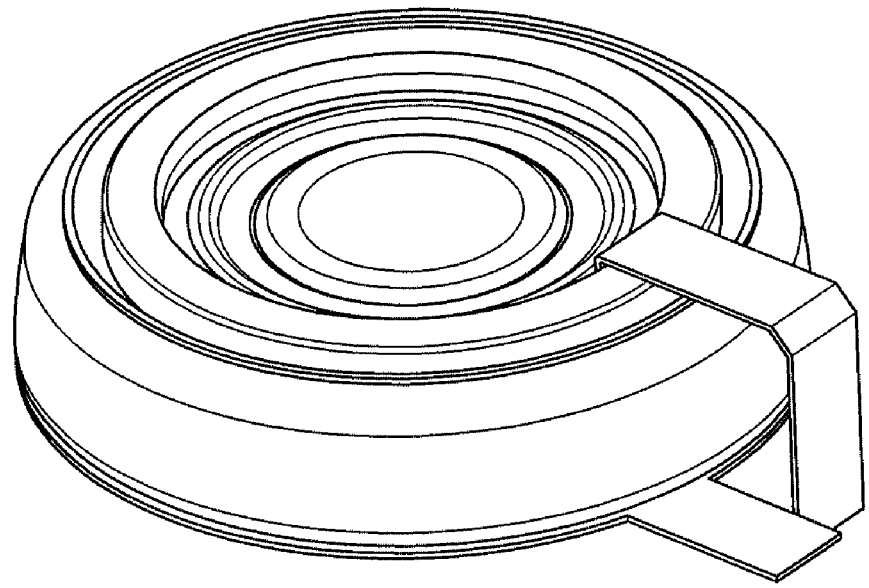

The present invention related to an optical device comprising a liquid lens having at least one fixed lens and a liquid lens holder wherein accurate datum of the liquid lens can be used in order to avoid at least partially active alignment process and ensure the best image quality (highest MTF) of the imaging device that integrate the optical device.

According to one embodiment of the invention, the flat flange glass molded lens (Z1 of FIG. 13) and its outer diameter can be used as reference on which the liquid lens holder may be centered (according to X and Y axis) and positioned according to a Z axis. In one example, the inner diameter of the liquid lens holder could be used as reference for centering with the other parts of the lens as well as the flat reference of the liquid lens holder bottom for accurate Z position. For easiness of integration that liquid lens holder will integrate at least one electrical contact for contacting one electrode of the liquid lens. Such electrical contacts could be for example FPC, MID or metal spring, similar for example to those described in patents EP1992968 or U.S. Pat. No. 7,573,646 in the name of the Applicant. According to a preferred embodiment, the liquid lens holder is made of a polymer material comprising two metallic spring electrical contacts. The liquid lens holder electrical contact allow applying a constant force in Z direction such that the liquid lens is always under pressure in order to stay in contact with the reference datum (for alignment) of the liquid lens holder. The liquid lens can be glued in the holder with a bonding that will keep the liquid lens able to respire. The glue may be for example a kind of silicon glue dispensed all around the liquid lens holder.

In a further embodiment, some active alignment may be performed as the liquid lens holder may not have all the necessary reference datum to align the liquid lens with the other optical elements. This may be the case when for example some features on the GM are not possible to implement. In such an embodiment, the liquid lens holder cap may require 2 μm accuracy in decenter between reference diameter and 5 μm accuracy between the 2 reference plane. Those accuracy are easily achievable in the industry with machine parts or molded plastic technique.

According to a further embodiment, an active alignment is needed. In that embodiment, the liquid lens holder of the optical device comprises a Z reference datum that can be taken on the liquid lens bodycone (for example Z2 in FIG. 13). Bodycone of the liquid lens may be made of metal machined parts or may be formed by a molded polymer. The reference in not taken directly on the GM lens, but since both parts can be manufactured with accuracy of about a few μm this will be accurate enough in most of the design case. The liquid lens holder comprises electrical contacts similar to those previously described and shown in the figures. Such an embodiment will require some active alignment at the lens module level to get the optimum optical performances.

In both cases the assembly of the liquid lens in the liquid lens holder comprising at least one electrical contact may take place at the liquid lens manufacturing level, such that the lens module manufacturer will receive a kind of plug and play assembly or be performed at the level of the lens module manufacturer. This will depends highly on the lens manufacturer capability.

According to another embodiment, the alignment of the liquid lens in the liquid lens holder may be performed according to XYZ directions during the manufacturing of the liquid lens, for example by using common metrology technique like the use of micrometer and/or optical means (Triptic Optocentric™ equipment). One advantage of this technique is to allow the use of inaccurate (cheap) liquid lens holder manufacturing process like metal stamping. One other advantage of using metal stamping is that high stiffness can be achieved with relatively thin sheet of metal (0.1, 0.15 mm) which will lead to an optimum Z thickness solution. At least one electrical contact may be integrated in the liquid lens holder in a similar way as the previously described, or slightly different if the liquid lens is made of metal. One electrical contact is for example done by the liquid lens holder and an electrically insulating ring (made of plastic for example) will be introduced between the liquid lens cap and the liquid lens holder in order to avoid electrical shortcut (see FIG. 9 to 12). The Z alignment may be performed by moving up and down the liquid lens in the liquid lens holder. A variable glue thickness may be used to compensate the gap. In an alternative embodiment, the liquid lens holder comprises means allowing adjusting the Z position, for example legs that can be plastically deformed when applying pressure in the Z direction from top to bottom.

One advantage of such an embodiment is that the lens module maker may receive an optical part that can be easily integrated with the rest of the lens stack, nearly like any other lens system.

According to another embodiment, the AA is performed at the lens module manufacturing level and not at the liquid lens level. In such an embodiment, the Z position is adjusted during the integration of the optical device, comprising the liquid lens and the liquid lens holder, in the lens module comprising other optical elements.

Figure 13:
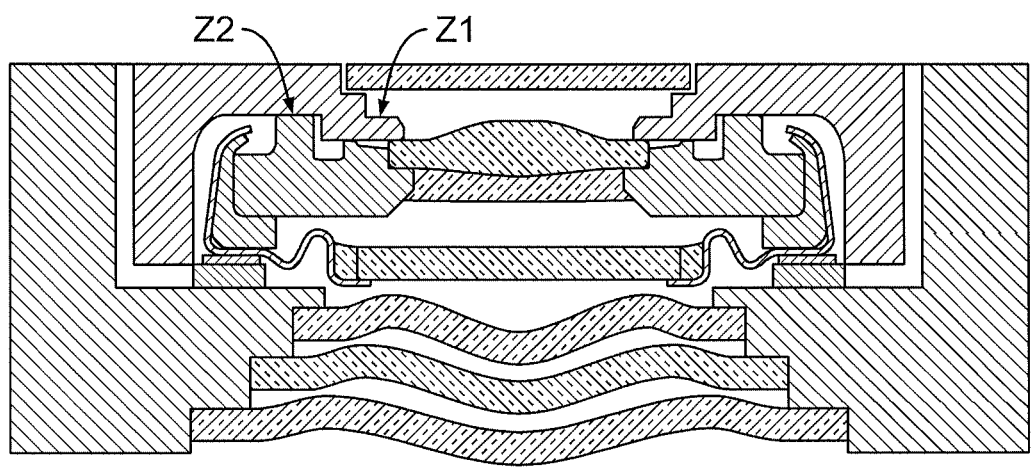
FIG. 13 is a partial cross section of a camera module comprising the optical element according to the invention.

According to another embodiment, the liquid lens holder comprises an aperture stop, as illustrated for example in FIG. 13. This solution is particularly well adapted for plastic molded liquid lens holder. One advantage is that all functions (electrical connection, alignment, stop aperture) are implemented in a single part which lead to cost saving.

According to another embodiment, the liquid lens holder comprises a protective window, as illustrated for example in FIG. 4,5, 9 or 13. This solution is particularly well adapted for plastic molded liquid lens holder. One advantage is that all functions (electrical connection, alignment, stop aperture) are implemented in a single part which lead to cost saving.

Combination of all the previous embodiments should be obvious for the man skilled in the art. For example optical device wherein a protective window as well as a stop could be integrated on the same part.

According to a further embodiment, the liquid lens holder is made of a polymer material. In such an embodiment, the liquid lens holder is for example 0.3-0.4 mm thick.

Figure 7:
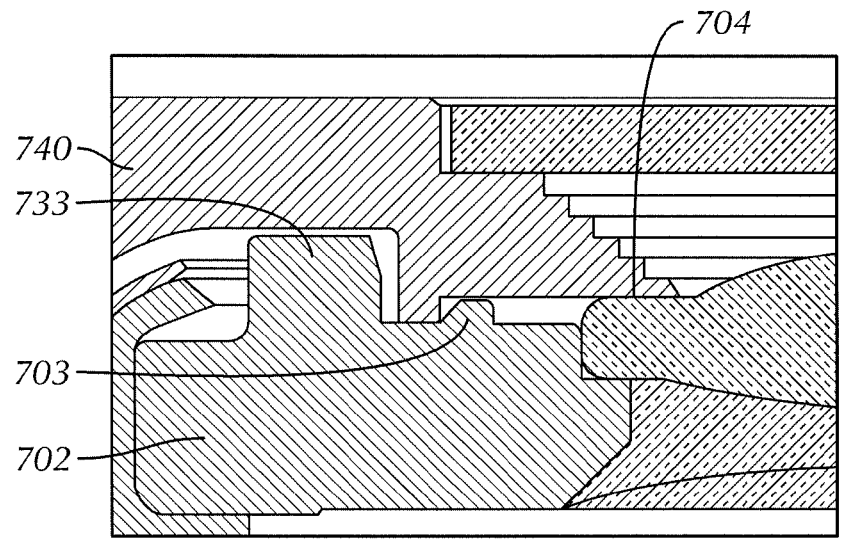
FIG. 7 shows a cross section of a detail of the optical element according to the invention and shown in FIG. 5, illustrating the reference for thickness.

FIG. 7: according to the invention, the best reference to minimize GM1 to P2 thickness tolerances may be: (1) the GM1 reference 704 allowing a very good tolerance, or (2) the leg 733 of the liquid lens body that provide a big outer diameter (OD). Other datum on the bodycone can be used, for example region 704 may be as shown on FIG. 7 between the foot of the liquid lens body 702 and the glass molded lens.

Figure 8:
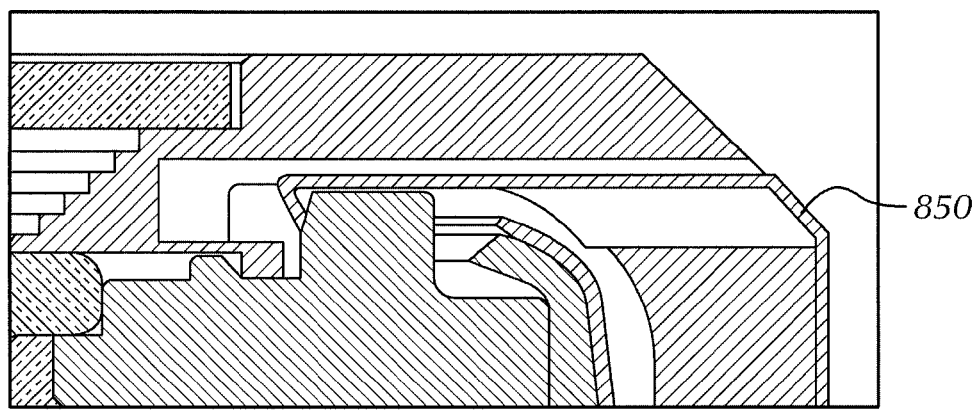
FIG. 8 is a cross section of a detail of the optical element according to the invention, showing in particular an example of how the electrical contact is contacting the body forming one electrode of the liquid lens.

FIG. 8 is a cross section of a detail of the optical element according to the invention, showing in particular an example of how the electrical contact is contacting the body forming one electrode of the liquid lens. The electrical contact 850 contacts the inside part of the foot of the liquid lens, This allow avoiding problems of bad electrical contact due to the insulating layer, for example a Parylene layer insulating the electrode from the liquid.

Figure 9:
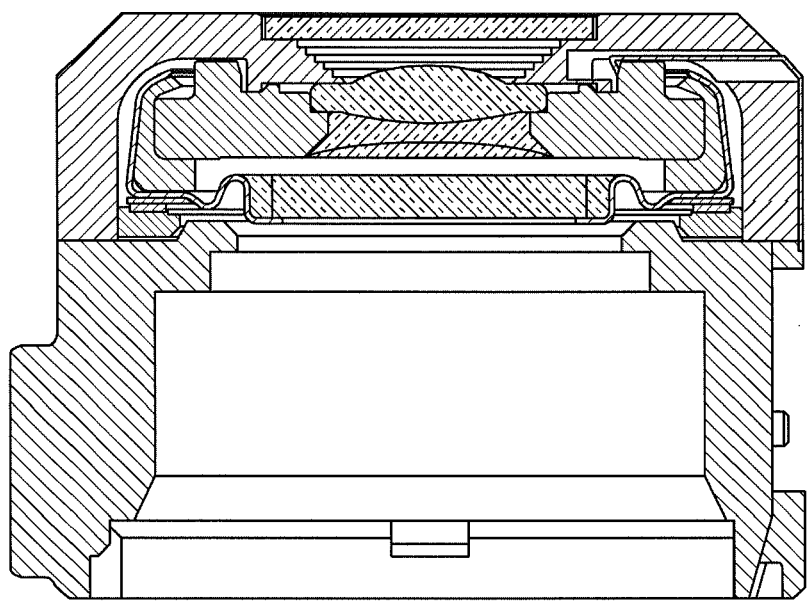
FIG. 9 is a cross section of a camera module comprising an optical element according to a further embodiment of the invention, wherein the liquid lens holder is made of a polymer material.

FIG. 9 is a cross section of a camera module comprising an optical element according to a further embodiment of the invention. In such an embodiment, the liquid lens holder integrating the liquid lens is made of a polymer material.

Figure 10:
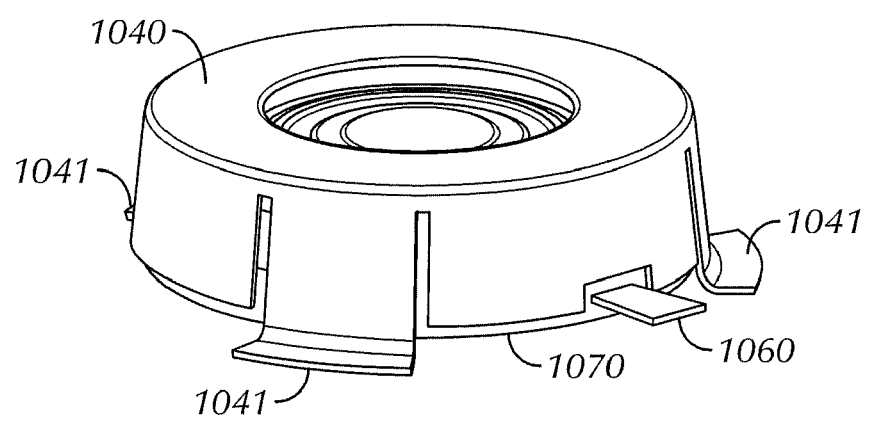
FIG. 10 is a 3D view of an optical element according to a further embodiment of the invention, wherein the holder is made of a conductive material.

FIG. 10 is a 3D view of an optical element according to a further embodiment of the invention. According to his embodiment, the holder 1040 of the liquid lens is made of a conductive material, for example is made of a metal. The holder may be formed by stamping a sheet of metal. The conductive holder may form the electrical contact that contacts the electrode of the liquid lens formed by the bodycone (also called second electrode of the liquid lens in relation to the first electrode formed by the cap of the liquid lens). Holder 1040 may comprise three legs that can be deformed, allowing adjusting the position according to Z axis. By pushing down the base of the legs, the internal diameter of the holder that contacts the outer diameter of the liquid lens will increase, and thus the liquid lens will move down. Another electrical contact 1060 is contacting the cap of the liquid lens. An insulating ring 1070 can be placed in-between the lens holder and the cap of the liquid lens to avoid electrical shortcut. The insulating ring can be placed anywhere but on the leg of the holder. The metallic cover is for example 0.1 mm thick.

Figure 11:
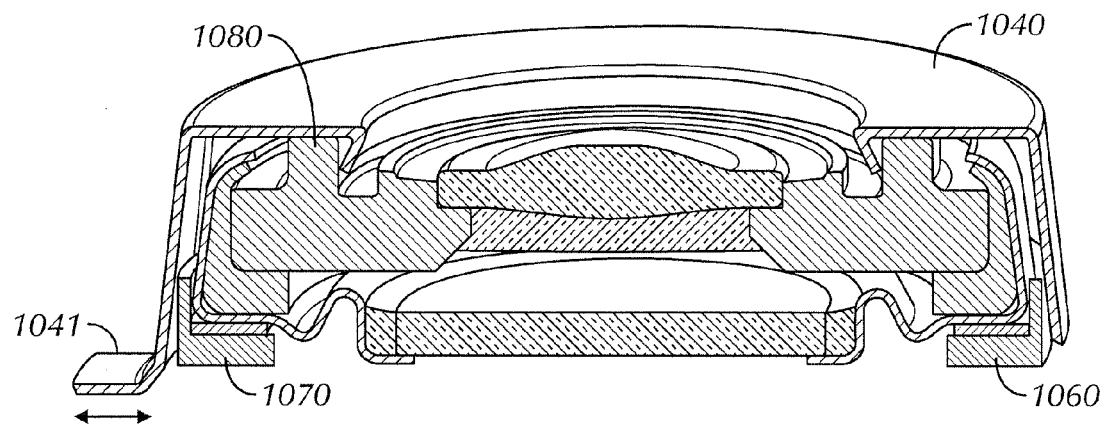
FIG. 11 is a cross section of the optical element as shown in FIG. 10.
Figure 12:
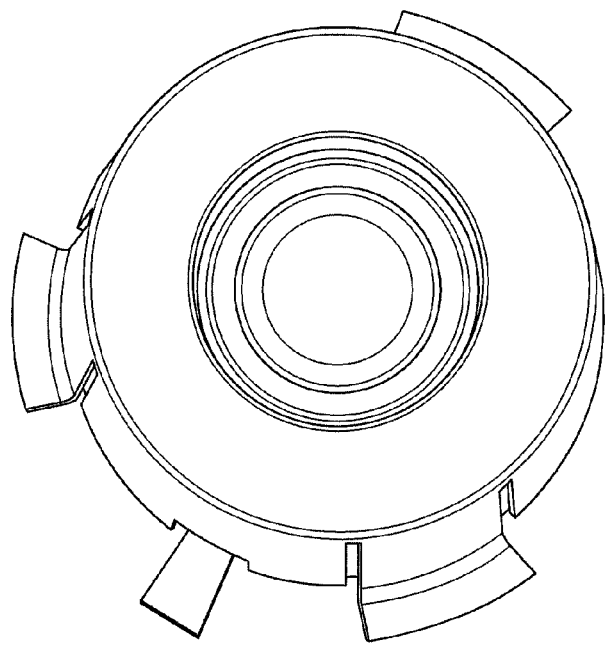
FIG. 12 is a 3D upper view of the optical element shown in FIGS. 10 and 11.

FIG. 11 is a cross section of the optical element shown in FIG. 10. Insulating ring 1070 insulated the first electrode of the liquid lens formed by the liquid lens cap from the liquid lens metallic holder 1040. Leg 1041 can bend and move radially when the liquid lens position according to Z axis is adjusted. Electrical contact 1060 is made of a conductive material, for example a metal or other conductive material, and is in this example sandwiched between the insulating ring 1070 and the cap of the liquid lens. Reference datum Z 1080 correspond in this example to the flat base surface of the foot of the liquid lens.

The invention claimed is:

1. An optical device for a lens assembly of a camera module, said optical device comprising:
    a liquid lens having at least one fixed lens and a transparent window, facing each other and delimiting, at least in part, an internal volume containing two immiscible liquids having different optical indices, a first and a second electrodes, said liquids forming an interface moveable by application of a voltage between said electrodes;
    a liquid lens holder, wherein said liquid lens holder comprised at least one electrical contact for contacting one electrode of the liquid lens, and comprising at least one Z reference datum for aligning said fixed lens of the liquid lens with other optical elements of the lens assembly.

2. The optical device according to claim 1, wherein said fixed lens of the liquid lens is a glass molded lens comprising a flat flange, the outer diameter of the flat flange being used as a mechanical reference for the positioning of the liquid lens holder.

3. The optical device of claim 1, wherein the liquid lens holder is made of a conductive material and form the electrical contact with said electrode of the liquid lens.

4. The optical device of claim 3, wherein the liquid lens holder further comprises a plurality of legs that can be deformed, allowing adjusting the position according to the Z axis.

5. A lens assembly comprising an optical device according to claim 1.

6. A camera module comprising a lens assembly according to claim 5.

* * * * *